United States Patent [19]

Asano et al.

[11] 4,097,283
[45] Jun. 27, 1978

[54] WATER-SOLUBLE COMPOSITION ADMIXTURE OF COPOLYMER HAVING ETHYLENIC UNSATURATION IN SIDE CHAIN AND ANTHRAQUINONE PHOTOSENSITIZER

[75] Inventors: Takateru Asano, Saitama; Keiko Ito, Ichikawa, both of Japan

[73] Assignee: Fuji Chemicals Industrial Company Limited, Tokyo, Japan

[21] Appl. No.: 640,925

[22] Filed: Dec. 15, 1975

[30] Foreign Application Priority Data

Dec. 28, 1974    Japan .................................. 50-1418

[51] Int. Cl.$^2$ ........................ G03C 1/68; G03C 1/70
[52] U.S. Cl. ............................ 96/115 R; 96/33; 96/35.1; 96/36; 96/36.3; 96/91 N; 204/159.14; 204/159.16; 204/159.18
[58] Field of Search ............... 96/115 R, 115 P, 91 N, 96/33, 35.1; 204/159.11, 159.16, 159.14, 159.18

[56] References Cited

U.S. PATENT DOCUMENTS

| | | | |
|---|---|---|---|
| 2,687,958 | 8/1954 | Neugebauer | 96/91 N |
| 3,357,831 | 12/1967 | Wu | 96/91 N |
| 3,418,295 | 12/1968 | Schoenthaler | 96/115 R |
| 3,684,516 | 8/1972 | Ishii | 96/115 R |
| 3,715,210 | 2/1973 | Watkinson et al. | 96/91 N |
| 3,721,566 | 3/1973 | Laridon et al. | 96/91 N |
| 3,733,200 | 5/1973 | Takaishi et al. | 96/91 N |
| 3,776,736 | 12/1973 | Davidson | 96/91 N |
| 3,795,640 | 3/1974 | Pande et al. | 96/115 R |
| 3,822,235 | 7/1974 | Hunter et al. | 96/91 N |
| 3,884,703 | 5/1975 | Oba et al. | 96/91 N |
| 3,989,610 | 11/1976 | Tsukada et al. | 96/115 R |
| 4,065,430 | 12/1977 | Satomura | 96/115 R |

*Primary Examiner*—Charles L. Bowers, Jr.
*Attorney, Agent, or Firm*—Brisebois & Kruger

[57] ABSTRACT

A water-soluble, photosensitive resin composition containing a water-soluble polymer having an ethylenic unsaturated bond in its side-chains, a water-soluble anthraquinone sulfonic acid or anthraquinone carboxylic acid sensitizer, or salts thereof, and if desired, a water-soluble azide compound.

7 Claims, No Drawings

WATER-SOLUBLE COMPOSITION ADMIXTURE OF COPOLYMER HAVING ETHYLENIC UNSATURATION IN SIDE CHAIN AND ANTHRAQUINONE PHOTOSENSITIZER

DETAILED DESCRIPTION OF THE INVENTION

The present invention relates to a water-soluble, photosensitive resin composition with good storage stability, which does not contain bichromates and which is rendered insoluble upon irradiation with light, in particular with ultraviolet rays. More concretely, it relates to a photoresist composition obtained by adding a water-soluble anthraquinone compound serving as a photosensitizer to a water-soluble polymer having an ethylenic unsaturated bond incorporated into the side chain.

Water-soluble, photosensitive compositions hitherto widely used as photoresists contain water-soluble resins and bichromates as their main components. As is well known, these compositions have, however, such disadvantages as extremely low storage stability or environmental pollution with hexavalent chromium. For this reason, compositions containing water-soluble diazo resins as sensitizers instead of bichromates have recently appeared, especially for the use in litho-printing. However, they also have defects, such as poor storage stability, low sensitivity, etc.

Attempts which have been made to use water-soluble bisazide compounds as sensitizers, have encountered some difficult problems in obtaining a practical degree of sensitivity and hardening. For instance only an insufficient photosensitivity has been obtained from any combination of a polymer containing an amide group, such as natural proteins (casein, gelatin, albumin and the like), or polyacrylamide, with water-soluble bisazide compounds or the combination of acrylamide or methacrylamide copolymers with water-soluble bisazide compounds as described in the Japanese Patent Laying Open Sho 47-30404. On the other hand, Japanese Patent Laying Open sho 47-19901 describes combinations of water-soluble bisazide compounds and water-soluble polymers of acrylic acids having an unsaturated bond incorporated into the side chain. Although a practical degree of photosenitivity can be obtained in this case, the storage stability is extremely low. This is assumed to be due to the reactivity of the azide group and double bond. A similar phenomenon can be observed, for example, when an azide compound is added to a cinnamic acid ester photosensitive resin.

The present inventors have carried out intensive investigations to overcome the above-mentioned shortcomings of water-soluble photoresists and completed the present invention by discovering the unexpected fact that the presence of a certain kind of water-soluble anthraquinone compound results in the quick cross-linking and curing of polymers having an ethylenic unsaturated bond incorporated into the side chain, when irradiated with light.

Specifically, the present invention relates to a water-soluble, photosensitive resin composition which contains, as its main components, a water-soluble polymer having an ethylenic unsaturated bond in the side chain (hereinafter usually called the water-soluble unsaturated polymer) and anthraquinone sulfonic acid or anthraquinone carboxylic acid, or salts thereof (hereinafter called water-soluble anthraquinone). An especially useful embodiment of the invention is a composition consisting of a water-soluble unsaturated polymer, a water-soluble anthraquinone, and a water-soluble azide compound, which also contains organic tertiary phosphines and, if desired, resinous binders.

The present invention will now be explained in more detail as follows:

To summarize the photochemical reaction involved in the present invention, the water-soluble anthraquinone absorbs energy from the rays of light which irradiate it. This energy is transmitted to the ethylenic unsaturated group. Upon receipt of this energy, the unsaturated group is activated and converted into a free radical, which is believed to participate in cross-linking, which takes place as a chain reaction. Although this appears to be a photopolymerization reaction, the composition of the present invention can be sufficiently insolubilized even in the absence of a photopolymerizable monomer (cross-linking agent). The well known bis-azide sensitizer (cross-linking agent) causes cross-linking by the insertion of nitrene formed upon photolysis of the azide group into the unsaturated bond. Also the thermal decomposition of the azide group into nitrene proceeds smoothly. This results in poor storage stability.

On the contrary, the water-soluble anthraquinone sensitizer of the present invention is believed to be merely a medium for energy transfer without causing material change, i.e. structural changes in the material. Such a reaction is influenced very little by heat and hence the storage stability of the composition is enhanced. However, it was found that the photosensitivity of this sensitizer gradually decreased during storage. This is a reverse reaction to an ordinary darkening reaction, i.e., fogging phenomenon. This may be due to the effect of oxygen as in the case of an ordinary photopolymerization system.

It was also found that the sensitivity and degree of hardening are markedly increased by adding a trace amount of a water-soluble azide compound to the above sensitizer. (Normally bis-azide compounds are used as cross-linking agents, but the scope of this invention is not limited to them). The amount of this azide required to be added may be only 1/10 – 1/100 that specified in the Japanese Patent Laying Open Sho 47-19901, an amount that would scarcely cause hardening if used alone.

Moreover, the addition of such a small amount exerts only a slight negative influence on the storage stability and if the amount is properly selected, the above mentioned darkening in the presence of oxygen can be almost eliminated. Furthermore, organic tertiary phosphines stabilize the azide group by forming chelates. Although the phosphines assist in improving storage stabilization to a certain extent after the addition of water-soluble azide compounds, it is not always necessary to employ them, because their water solubility and compatibility with other ingredients are poor. Consequently, it is preferred to use them only when long-term storage is required.

It is possible to synthesize the water-soluble unsaturated polymer by various well known processes. In the following one example of a process for the manufacture of the water-soluble unsaturated polymer suitable for use in the present invention will be described in detail. This process comprises the steps of polymerizing an unsaturated amide compound and an unsaturated carboxylic acid or salts thereof and, if occasion demands, one or more kinds of vinyl monomers which are co-polymerizable with them in a conventional manner to provide a polymer hereinafter referred to as the prepolymer, and reacting the prepolymer with ethylenic unsaturated compounds having an oxirane ring.

Effective unsaturated amide compounds include acrylamide, methacrylamide, diacetoneacrylamide, maleic diamide, crotonamide, itacondiamide and fumaric diamide. Suitable unsaturated carboxylic acids or salts thereof include acrylic acid, methacrylic acid, itaconic acid, crotonic acid, maleic acid, fumaric acid and salts thereof with K, Na, Li, $NH_4$, and organic amines.

In addition, the vinyl monomers which are co-polymerizable with the above described unsaturated compounds include vinyl acetate, vinyl propionate, styrene and alkyl esters, hydroxyalkyl esters or aminoalkyl esters of unsaturated carboxylic acids, preferably, methyl, ethyl, propyl, butyl, octyl, hydroxyethyl, hydroxypropyl, and dimethyl aminoethyl acrylates or methacrylates.

Applicants have examined various practical, characteristic properties such as water-solubility, film-forming ability, adhesion, flexibility and strength of film and etch-resistance as a resist-film, and found as a result that the composition of the prepolymer preferably contains at least one unsaturated amide compound in a 40 – 95 mol % range, and preferably 50 – 80 mol %, at least one unsaturated carboxylic acid or salt thereof in the range of 5 – 10 mol % and may contain one of more alkyl esters of unsaturated carboxylic acid in the range of 0 – 30 mol % and one or more hydroxyalkyl esters of unsaturated carboxylic acid in a range of 0 – 30 mol %.

When less than 40 mol % of the unsaturated amide compound is used, not only does the water-solubility decrease, but so does the amount of ethylenic unsaturated compound having an oxylane ring to be added, thereby markedly lowering the cross-linking density produced by the light-exposure. Hence, no satisfactory sensitivity can be attained.

When the proportion of the unsaturated carboxylic acid or the salts thereof exceeds 10 mol %, it appears to have an undesirable influence upon storage stability, flexibility of film, etc. and also upon the water-resistance of the sensitized film. On the other hand, with less than 5 mol % of unsaturated carboxylic acid, the adhesion to the substrate is not sufficient and the sensitivity decreases.

The ethylenic unsaturated compound having an oxirane ring may be added to the prepolymer by heating the ethylenic unsaturated compound having an oxirane ring, for example, an unsaturated epoxy compound such as glycidyl methacrylate, allyl glycidyl ether, α-ethyl glycidyl ether, crotonyl glycidyl ether, glycidyl crotonate, monoalkyl monoglycidyl itaconate, monoalkyl monoglycidyl fumarate, monoalkyl monoglycidyl maleate, etc., at 0.1 – 0.6 molar equivalents to the amide group and carboxylic group contained in the prepolymer at 50° – 90° C in the presence of an ordinary polymerization inhibitor such as hydroquinone, benzoquinone and the like for 2 – 10 hours. The amount of the above mentioned unsaturated epoxy compound to be added is preferably 0.1 ~ 0.6 molar equivalents against amide group and carboxylic group in view of sensitivity and storage stability.

The water-soluble copolymer obtained by the above mentioned reaction process is remarkably superior in properties such as sensitivity, adhesion, developability and etch-resistance. It can be also purified by precipitating the polymer in a water-soluble organic solvent, if desired.

The following compounds can be used as water-soluble anthraquinone sensitizers which feature the present invention:

Anthraquinone-1, 8-disulfonic acid (or salts thereof)
Anthraquinone-1, 5-disulfonic acid (or salts thereof)
Anthraquinone-2, 6-disulfonic acid (or salts thereof)
Anthraquinone-2, 7-disulfonic acid (or salts thereof)
Anthraquinone-α-sulfonic acid (or salts thereof)
Anthraquinone-β-sulfonic acid (or salts thereof)
Anthraquinone-α-carboxylic acid (or salts thereof)
Anthraquinone-β-carboxylic acid (or salts thereof)

The following water soluble azide compouns can be use:

4, 4'-Diazidostilbene-2, 2'-disulfonic acid (or salts thereof)
4-Azidobenzalmethyl-oxide-2-sulfonic acid (or salts thereof)
4, 4'-Diazidobenzalacetone-2, 2'-disulfonic acid (or salts thereof)
2, 5-(p, p'-Diazidobenzal)cyclohexanone-m, m'-disulfonic acid (or salts thereof)
4, 4'-Diazidostilbene-γ-carboxylic acid (or salts thereof)
4-Azidochalcone-2-sulfonic acid (or salts thereof)
4-Azidochalcone-2'-sulfonic acid (or salts thereof)
4-Azidochalcone-2', 4'-disulfonic acid (or salts thereof)

Since the water-soluble azide compound employed in the present invention is used for the purpose of strengthening the sensitization effect of the water-soluble anthraquinone sensitizer, the amount added can be less than 1% by weight to the water-soluble unsaturated polymer. The addition of a larger amount should be avoided, because a darkening reaction then occurs during storage. Water-soluble anthraquinone is added in an amount having a weight equal to 0.5 ~ 20% of that of the water-soluble unsaturated polymer. When anthraquinone alone is used as sensitizer, the photosensitivity decreases gradually during storage. The addition of a water-soluble azide compound is also effective in reducing the decrease in storage stability presumably caused by the influence of oxygen. The following compounds can be used as organic tertiary phosphines:

Phosphine, trimethylphosphine, ethylphosphine, phenylphosphine, diphenylphosphine, dimethylphosphine, ethyldiphenylphosphine, triphenylphosphine, triisopropylphosphine, trichlorophenylphosphine, triaminophenylphosphine, tris(n-octyl)-phosphine, etc.

The above mentioned compounds have the ability to stabilize, in particular, the azide compounds and also to thermally stabilize the unsaturated groups. Many of them show poor water solubility, but a sufficient effect can be attained by completely dispersing them. It is sufficient to add an amount having a weight which is less than 1% of that of the water-soluble unsaturated polymer.

The addition of other binder resins may be made in dependence on the particular application so as to change the various physical properties to provide compositions which are suitable for different purposes. The following polymers can be employed as binder resins suitable for the above purpose:

Gum arabic, shellac, casein, gelatin, glue, cellulose and derivatives thereof, starch, polyvinylalcohol, polyvinylpyrrolidone, polyvinylpyridine, polyvinylether, polyethylene oxide, water-soluble polymers like water-soluble acrylic resin and aqueous emulsions of polyvinyl acetate, silicone resin, acrylic resin, etc.

The present invention offers lower priced water-soluble, photosensitive resin compositions which are easy to manufacture and which have very high storage stability, practical sensitivity and degree of hardening, and which do not cause heavy metal pollution. They can be applied, for instance, as weak alkaline, aqueous solutions (water-soluble organic solvents can be added in an amount of less than 20%) to plate making of metal relief plate, i.e., deep-etch, litho-plate, multi-metal plate printing, etc., and photoetching processing of metal in place of the conventional bichromated photoresists. Furthermore, these compositions can be used in making so-called presensitized plates (PS plates), by applying as a sensitive layer to printing plates or metal plates to be processed beforehand.

The following examples will show the present invention in more detail. The present invention is not, however, limited to such examples. The term "part," when used herein, means "part by weight."

POLYMER EXAMPLE 1

44.7 Parts of acrylamide, 6.02 parts of methacrylic acid, 8.6 parts of methyl acrylate and 23.2 parts of 2-hydroxylethylacrylate were dissolved in a mixture of 222.7 parts of water and 24.7 parts of 2-propanol. This solution was polymerized in the presence of 0.25 parts of 2, 2'-azobis (2-amidinopropane) hydrochloride as a polymerization initiator in a stream of nitrogen at 80° C for 10 hrs. The 2-propanol was removed under reduced pressure. Subsequently, 0.005 parts of hydroquinone and 14 parts of glycidyl methacrylate were added and the reaction was continued at 75° C for 4 hrs.

POLYMER EXAMPLE 2

35.5 Parts of acrylamide, 5.88 parts of (pure) ammonium acrylate, 13 parts of ethyl acrylate, and 39 parts of 2-hydroxyethylmethacrylate hydroxylethylacrylate were dissolved in a mixture of 224.5 parts of water with 56.1 parts of methanol. This solution was polymerized with 0.56 parts of ammonium azobiscyanovaleate as a polymerization initiator in a stream of nitrogen at 75° C for 9 hrs. Then, 0.075 parts of benzoquinone and 24.2 parts of glycidyl methacrylate were added and the reaction was continued at 85° C for 3 hrs. The copolymer having an ethylenic unsaturated bond in its side chain (hereinafter called the addition copolymer) obtained by the above method as purified by precipitation in 2-propanol.

POLYMER EXAMPLE 3

42.6 Parts of acrylamide, 7.74 parts of (pure) ammonium methacrylate, 16.5 parts of ethyl acrylate and 16.8 parts of 2-hydroxylethylacrylate were dissolved into 251 parts of water. This solution was polymerized by adding 0.33 parts of 2, 2'-azobis (2-amidinopropane) hydrochloride in a stream of nitrogen at 80° C for 8 hrs. Then, 0.008 parts of hydroquinone and 25 parts of glycidyl methacrylate were added and the reaction was continued at 75° C for 3 hrs. The addition copolymer obtained was purified by precipitation in acetone.

POLYMER EXAMPLE 4

56.8 Parts of acrylamide, 8.6 parts of ammonium methacrylate (pure) and 10 parts of ethyl acrylate were dissolved in a mixture of 203.5 parts of water with 22.6 parts of 2-propanol. The solution was polymerized in the presence of 0.37 part of potassium persulfate in a stream of nitrogen at 80° C for 9 hrs. Then, 0.015 part of hydroquinone and 51.1 parts of glycidyl methacrylate were added and the reaction was continued at 85° C for 2 hrs. The addition copolymer obtained as above was purified by precipitation in acetone.

POLYMER EXAMPLE 5

49.7 Parts of acrylamide, 5.76 parts of acrylic acid, 11.4 parts of ethylmethacrylate and 17.28 parts of hydroxypropyl methacrylate were dissolved in 220.2 parts of water together with 50.5 parts of methanol. The solution was polymerized in the presence of 0.43 part of ammonium azobiscyanovaleate as a polymerization initiator in a nitrogen stream at 75° C for 9 hrs. Then, 0.005 part of hydroquinone and 22.15 parts of glycidyl methacrylate were added and the reaction was continued at 80° C for 3 hrs.

EXAMPLE 1

21 Parts of the aqueous solution of water-soluble unsaturated polymer obtained in Polymer Example 1 and 1.2 parts of sodium anthraquinone-1.8-disulfonate were dissolved in 72 parts of water. The solution was filtered and used as a sensitive liquid. This was applied onto an iron plate for a shadow mask through immersion, and dried at 70° C for 10 min. The plate was exposed in contact with a negative film by using a perfecting machine (2 kw mercury lamp, for 30 sec.) and showered with water for development. After post-baking at 120° C for 15 min., etching was effected bifacially with 45° Be ferric chloride solution. The plate was soaked in a 15% aqueous solution of sodium hydroxide at 60° C to obtain a shadow mask after removing the resist film.

EXAMPLE 2

6 Parts of the water-soluble unsaturated polymer obtained in Polymer Example 2, 0.4 parts of sodium anthraquinone-$\beta$-sulfonate, 0.05 parts of sodium 4, 4'-diazidostilbene-2, 2'-disulfonate, 0.06 parts of trimethylphosphine and 0.05 parts of crystal violet dye were dissolved in 94 parts of water. The solution was filtered and used as a sensitive liquid.

This was applied onto a copper-clad laminate for printed circuits by means of a whirler. The laminate was dried, exposed in contact with a negative film with the carbon arc lamp (100 V, 30 Amp, at a distance of 50 cm) for 1 min., and washed with a spray of water for development.

After drying, the laminate was etched with a 45° Be ferric chloride solution. The film was removed with a 10% aqueous solution of sodium hydroxide to prepare printed circuits.

EXAMPLE 3

7 Parts of the water-soluble unsaturated polymer obtained in Polymer Example 3, 0.4 parts of sodium anthraquinone-$\beta$-sulfonate, 0.08 parts of sodium 4-azidochalcone-2-sulfonate and 0.05 parts of methyl violet (dye) were dissolved in 93 parts of water. The solution was filtered and used as a sensitive liquid. This was applied onto a mechanically grained aluminum plate for offset printing by using a whirler. The plate was dried, exposed in contact with a positive film, and washed with water to obtain a negative image. After stopping out, lacquering and tincturing, a positive image was obtained upon removing the film with a 5% aqueous solution of sodium metasilicate. As mentioned above, the application of this sensitive liquid to a deep-etch process offers many advantages as compared with the conventional bichromated sensitive materials, for example, easy removal of the lacquer at exposed areas and simplifying of the film removing process.

This pre-sensitized (PS) plate can be preserved in a cold and dark place for more than 3 months without degrading the quality.

EXAMPLE 4

6 Parts of the water-soluble unsaturated polymer of Polymer Example 3 was dissolved into 94 parts of water together with 0.8 part of sodium 2, 5-(p,p'-diazidobenzal) cyclo-hexanone-m, m'-disulfonate, 0.06 part of triphenyl phosphine and 0.05 part of methyl violet. The solution was used as a sensitive liquid after filtration. This was applied onto an anodized aluminum plate for offset printing to obtain a PS plate to be used for deep-etching as described in Example 3.

EXAMPLE 5

12 Parts of the water-soluble unsaturated polymer obtained in Polymer Example 4 was dissolved in 88 parts of water together with 0.8 parts of sodium anthraquinone-1, 8-disulfonate, 0.09 parts of sodium 4, 4'-diazidobenzalacetone-2, 2'-disulfonate and 0.1 part of triphenylphosphine. The solution was mixed with 60 parts of vinyl acetate emulsion to prepare a sensitive emulsion for screen printing. The sensitive emulsion was applied onto screen fabrics (of polyethylene terephthalate fiber, 200 mesh) and dried. The screen was exposed in contact with a positive film for 3 min. by means of a carbon arc lamp and washed with water to remove the unexposed areas. The image of the screen printing plate obtained was very sharp.

EXAMPLE 6

22 Parts of the water-soluble unsaturated polymer obtained in Polymer Example 5 was dissolved into 70 parts of water together with 0.8 parts of sodium anthraquinone-$\beta$-sulfonate, 0.06 parts of sodium 4-azidochalcone-2-sulfonate and 0.05 parts of methyl violet. The solution was used as a sensitive liquid after filtration. This was applied onto a trimetal plate for offset printing composed of iron, copper and chromium. The plate was dried, exposed in contact with a positive film and washed with water for development. Subsequently, the chromium layer at nonimage areas was removed by etching with an etching liquid for trimetal plate making containing a saturated aqueous solution of calcium chloride as its main component.

After the film was removed with a 5% aqueous caustic soda, the plate was sensitized and inked up to complete the preparation of the trimetal plate for offset printing.

What is claimed is:

1. A water-soluble, photosensitive resin composition comprising a mixture of
   (a) a water-soluble unsaturated copolymer having an ethylenic unsaturated bond in the side chain obtained by reacting a prepolymer which is formed by addition polymerization of 40–95 mol% of an unsaturated amide compound, 5–10 mol% of an unsaturated carboxylic acid or salts thereof and each 0–30 mol% of at least one vinyl monomer which is co-polymerizable with the unsaturated amide and unsaturated carboxylic acid or salts thereof selected from the group consisting of vinyl acetate, vinyl propionate, styrene and alkyl-, hydroxyalkyl- or aminoalkylesters of unsaturated carboxylic acid, with an ethylenic unsaturated compound having an oxirane ring under heating in the presence of a polymerization inhibitor, and
   (b) a water soluble anthraquinone sulfonic acid, anthraquinone carboxylic acid or salts thereof as photosensitizer, the amount of the ingredient (b) being 0.5 – 20% with respect to the weight of the ingredient a).

2. The composition of claim 1, in which the molar ratio of said ethylenic unsaturated compound having an oxirane ring to the total of the amide groups and the carboxylic groups contained in the prepolymer of 0.1 – 0.6:1.

3. The composition of claim 1 in which said unsaturated amide compound constitutes 50 – 80 mol % of said prepolymer.

4. The composition of claim 1, in which said prepolymer contains 0 – 30 mol % alkyl esters or hydroxyalkyl esters of unsaturated carboxylic acids.

5. The composition of claim 1, which contains a photosensitivity and hardness increasing amount of a water-soluble azide.

6. The composition of claim 5, which contains an azide stabilizing amount of an organic tertiary phosphine.

7. The composition of claim 5, wherein the quantity of said water-soluble azide compound has a weight equal to less than 1% of that of said water-soluble polymer.

* * * * *